(12) United States Patent
Zhuang

(10) Patent No.: US 8,154,874 B2
(45) Date of Patent: Apr. 10, 2012

(54) USE OF FLEXIBLE CIRCUITS IN A POWER MODULE FOR FORMING CONNECTIONS TO POWER DEVICES

(75) Inventor: Weidong Zhuang, Worcester, MA (US)

(73) Assignee: International Rectifier Corporation, El Segundo, CA (US)

( * ) Notice: Subject to any disclaimer, the term of this patent is extended or adjusted under 35 U.S.C. 154(b) by 398 days.

(21) Appl. No.: 11/471,849

(22) Filed: Jun. 21, 2006

(65) Prior Publication Data

US 2007/0297147 A1 Dec. 27, 2007

(51) Int. Cl.
*H05K 7/00* (2006.01)

(52) U.S. Cl. .................. 361/728; 361/767; 361/747

(58) Field of Classification Search .......... 361/749–750, 361/747, 767, 777, 720, 748, 760; 257/690–692; 174/254–255, 260–262
See application file for complete search history.

(56) References Cited

U.S. PATENT DOCUMENTS

| | | | |
|---|---|---|---|
| 4,974,121 A | 11/1990 | Masuko et al. | 361/428 |
| 5,856,913 A | 1/1999 | Heilbronner | 361/760 |
| 6,359,331 B1* | 3/2002 | Rinehart et al. | 257/691 |
| 6,797,891 B1* | 9/2004 | Blair et al. | 174/268 |
| 6,882,538 B1* | 4/2005 | Frisch | 361/728 |
| 7,629,537 B2* | 12/2009 | Ice | 174/254 |
| 2003/0107120 A1* | 6/2003 | Connah et al. | 257/691 |
| 2005/0040513 A1* | 2/2005 | Salmon | 257/698 |

\* cited by examiner

*Primary Examiner* — Hung S Bui

(74) *Attorney, Agent, or Firm* — Farjami & Farjami LLP

(57) ABSTRACT

A power module includes a power switching device and a flexible circuit with first and second traces electrically connected to the switching device, the first and second traces serving as an input signal carrier and an output signal carrier for the switching device.

10 Claims, 3 Drawing Sheets

USE OF FLEXIBLE CIRCUITS IN A POWER MODULE FOR FORMING CONNECTIONS TO POWER DEVICES

BACKGROUND OF THE INVENTION

1. Field of the Invention

The present invention relates generally to power modules, and more specifically, to the use of flexible circuits in a power module for forming connections to power semiconductor devices.

2. Description of the Prior Art

Referring to FIG. 1 there is shown a top view of a portion of a power module 100 according to the prior art. Power module 100 includes a substrate 102. Formed on the top surface of substrate 102, and possibly within and along the bottom surface thereof, are one or more traces/pads made of copper or the like, such as trace 103. Mounted to these traces are a plurality of semiconductor devices including one or more power switching devices, such as device 104. As an example, the power switching devices may be IGBTs.

Switching device 104 may include along a top surface thereof a first power electrode 106 and a control electrode 108. Along the bottom surface of switching device 104 may be a second power electrode that is mounted to trace 103. The first and second power electrodes may be an emitter electrode and a collector electrode and the control electrode may be a gate electrode. Although not shown in FIG. 1, first power electrode 106 may be wire bonded by a plurality of wire bonds to one or more other traces and/or devices of power module 100.

Power module 100 further includes a first I/O (input-output) contact 110 and a second I/O contact 112 associated with switching device 104. As shown in FIG. 1, the first and second I/O contacts may each include a pad 114 integral with a metal solder lug 116. The first and second I/O contacts are electrically connected to an input and an output of switching device 104. For example, a wire bond 118 may connect the gate electrode 108 of switching device 104 to pad 114 of first I/O contact 110, thereby providing an input gate connection for device 104. Similarly, a wire bond 120 may connect the emitter electrode 106 of switching device 104 to pad 114 of second I/O contact 112, thereby providing an output current sense connection for the device. One skilled in the art will recognize that rather than connecting the emitter electrode 106 of switching device 104 to second I/O contact 112 to obtain a current sense connection, the collector electrode may be connected to the second I/O contact. Similarly, one skilled in the art will also recognize that switching device 104 may include a dedicated current sense output connection that may be interfaced to second I/O contact 112.

Power module 100 further includes a first terminal lead 122 and a second terminal lead 124 associated with switching device 104. As shown in FIG. 1, each of the first and second terminal leads may include a metal solder lug 126 integral with a pad 128, which pad provides for external connection/access to power module 100.

As shown in FIG. 1, wire pairs, such as wires 130 and 132, are used to connect the I/O contacts 110 and 112 of device 104 to terminal leads 122 and 124. Here, wire 130 connects I/O contact 110 to terminal lead 122 and wire 132 connects I/O contact 112 to terminal lead 124. As an example, wires 130 and 132 may be soldered to lugs 116 and 126 of the respective I/O contacts and terminal leads. As shown, wires 130 and 132 are typically twisted in order to reduce the effect of inductive coupling between the two wires, as is known in the art.

In general, the first and second terminal leads 122 and 124 of power module 100 provide an external connection through which control signals can be sent to gate electrode 108 of switching device 104 and through which the current of switching device 104 can be sensed. As an example, a gate driver may be operatively connected to pads 126 of terminal leads 122 and 124 to provide gate control signals to switching device 104 and to sense the current of the switching device.

One skilled in the art will recognize that if power module 100 includes additional switching devices, these additional devices may have a similar configuration as switching device 104.

Notably, the use of twisted wires in power modules like module 100 have several drawbacks. In particular, each wire is typically manually soldered between corresponding pairs of lugs 116 and 126. This manual soldering can be difficult to perform and can lead to long process times in manufacturing a module, thereby affecting cost. In addition, the use of wires in general can lead to variations in wire length between modules and thereby variations in gate loop between modules. Again, controlling such variations leads to increased process control, which can also affect cost.

SUMMARY OF THE INVENTION

According to an embodiment of the invention, a power module includes a substrate with one or more power switching devices mounted thereto. Each switching device may include first and second power electrodes and a control electrode. According to a preferred embodiment of the invention, the switching devices are IGBTs, but may be other types of switching devices, including MOSFETS.

According to an embodiment of the invention, associated with each switching device are first and second I/O contacts and first and second terminal leads, which leads provide external access to the module. The I/O contacts for each switching device may be electrically connected to an input and an output of the switching device. For example, the first I/O contact may be electrically connected to the control electrode of the switching device and the second I/O contact may be electrically connected to one of the power electrodes of the switching device, thereby providing an output current sense connection for the device.

According to an embodiment of the invention, the power module also includes one or more flexible circuits (flex circuits) that connect the first and second I/O contacts to the first and second terminal leads for each of the respective switching devices. To establish these connections, the flex circuits have pairs of conductive traces for each respective switching device for which the flex circuit establishes connections.

According to an embodiment of the invention, each flex circuit includes at least two conductive layers disposed along an upper and lower side of a dielectric layer. Preferably, the pair of conductive traces for each switching device are configured such that one trace resides in one conductive layer and the other trace resides in the other conductive layer. In addition, the pair of traces for each switching device are preferably configured such that the trace disposed in the upper conductive layer substantially resides directly over the trace disposed in the lower conductive layer. In this fashion, the pair of traces for a given switching device run substantially in parallel along the flex circuit.

According to an embodiment of the invention, each trace pair within a flex circuit for a given switching device is configured such that one trace is electrically connected between the first I/O contact and the first terminal lead associated with the switching device and the second trace is electrically connected between the second I/O contact and second terminal lead associated with the switching device. In this fashion, the control electrode and current sense connection of the switching device are connected to the first and second terminal leads.

According to another embodiment of the invention, gate protection devices may be directly mounted on the flex circuits and connected to the traces corresponding to the control electrodes of the devices. Similarly, gate resistors may be directly mounted on the flex circuits for one or more of the switching devices. According to a further embodiment of the invention, one or more gate drivers may be directly mounted on the flex circuits and connected to the traces corresponding to the control electrodes of the devices. Here, the traces corresponding to the control electrodes may terminate at the gate drivers rather than at terminal leads. Similarly, the current sense connections of the switching devices may also be integrated with these flex circuits, such as placing shunt resistors on the flex circuits in the switching device current paths.

Advantageously, the flex circuits of the present invention are simpler to install as compared to the twisted wire pairs of the prior art, thereby reducing manufacturing costs. In addition, the flex circuits create consistency between power modules and make it easier to design a balanced gate loop and easier to design for high voltage isolation. Furthermore, the use of parallel traces achieves the same affect as the twisted wire pairs, reducing the inductive coupling between the traces.

Other features and advantages of the present invention will become apparent from the following description of the invention which refers to the accompanying drawings.

DETAILED DESCRIPTION OF THE PREFERRED EMBODIMENTS

Figure 1:
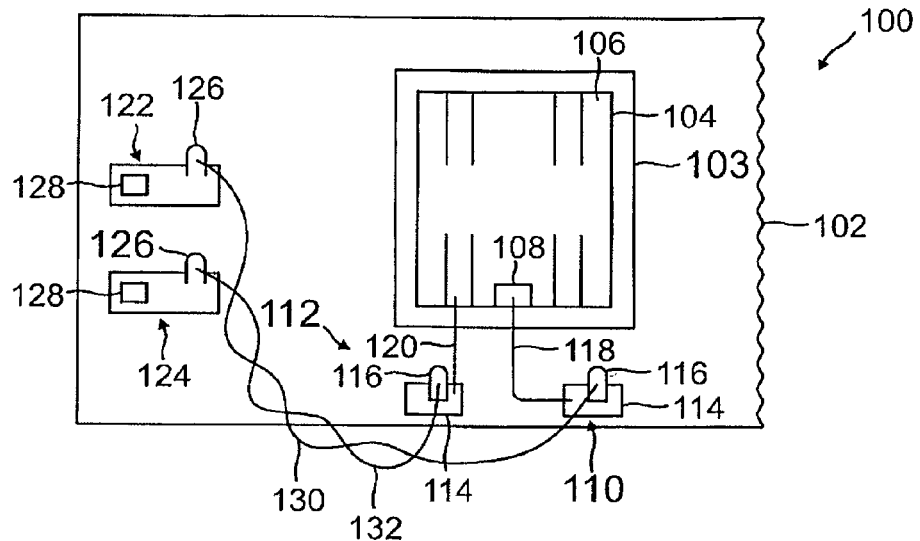
FIG. 1 shows a top view of a portion of a power module according to the prior art.
Figure 2:
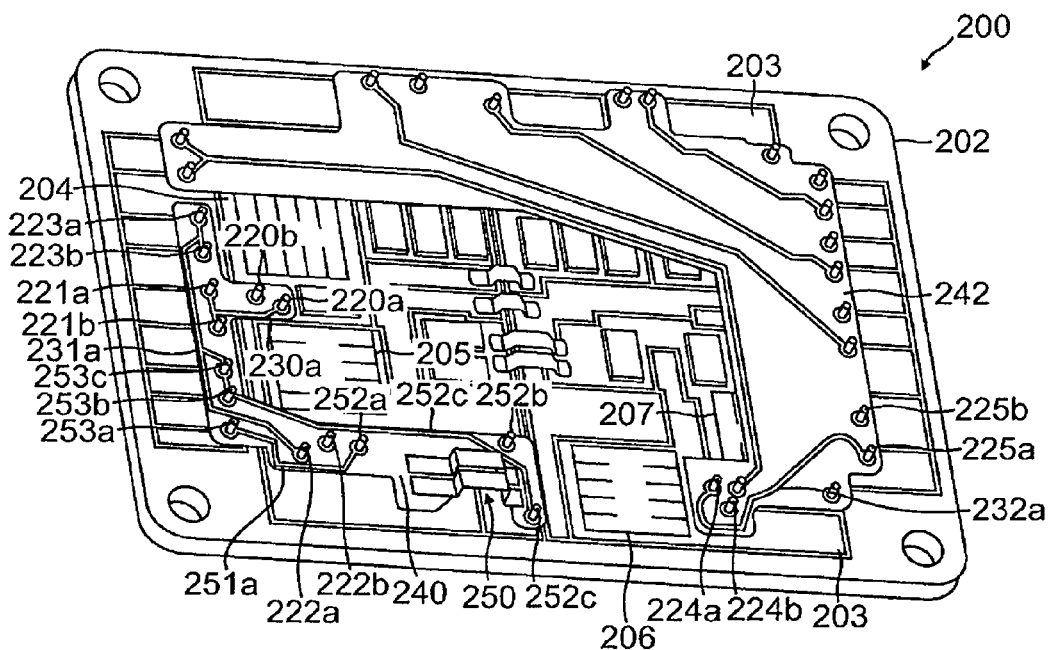
FIG. 2 shows a top perspective view of a power module according to an embodiment of the invention, the power module including flexible circuits for forming connections to power switching devices.

Referring to FIG. 2 there is shown a top perspective view of a power module 200 according to an embodiment of the invention. Power module 200 includes a substrate 202 made of any suitable material known in the art. Formed on the top surface of substrate 202, and possibly within and along the bottom surface thereof, are one or more traces/pads, such as traces 203, made of copper or the like. Mounted to these traces are a plurality of semiconductor devices, including one or more power switching devices, such as power switching devices 204-207 (note that power module 200 includes additional power switching devices that are concealed by flexible circuits 240 and 242, which are further described below). As an example, power module 200 may be a high reliability power module used for applications such as aerospace.

Each switching device 204-207 may include a first power electrode and a control electrode along a top surface thereof and a second power electrode along a bottom surface thereof and mounted to a trace of substrate 202. According to a preferred embodiment of the invention, the switching devices are IGBTs. Accordingly, the first and second power electrodes may be an emitter electrode and a collector electrode respectively and the control electrode may be a gate electrode. Nonetheless, the switching devices do not need to be IGBTs and may be other types of switching devices, including MOSFETS.

According to an embodiment of the invention, associated with each switching device are first and second I/O contacts and first and second terminal leads, which contacts and terminal leads may be similar to I/O contacts 110 and 112 and terminal leads 122 and 124 of device 104 of power module 100. For example, I/O contacts 220a/220b and terminal leads 221a/221b may be associated with switching device 204, I/O contacts 222a/222b and terminal leads 223a/223b may be associated with switching device 205, and I/O contacts 224a/224b and terminal leads 225a/225b may be associated with switching device 206. As shown in FIG. 2, each of the I/O contacts and terminal leads may include a solder slug.

Similar to device 104, the I/O contacts for each switching device 204-207 may be electrically connected to an input and an output of the switching device. For example, the first I/O contact may be electrically connected to the control electrode of the switching device, thereby providing an input control connection for the device. Similarly, the second I/O contact may be electrically connected to one of the power electrodes of the switching device, thereby providing an output current sense connection for the device. Alternatively, the switching device may include a dedicated current sense output connection to which the second I/O contact may be electrically connected.

According to an embodiment of the invention, power module 200 also includes one or more flexible circuits (flex circuits), such as flex circuits 240 and 242, that connect the first and second I/O contacts to the first and second terminal leads for each of the respective switching devices 204-207. To establish these connections, flex circuits 240 and 242 have pairs of conductive traces for each respective switching device for which the flex circuit establishes connections. For example, flex circuit 240 includes a pair of conductive traces 230a and 230b (trace 230b is not shown in FIG. 2), each of which connects a respective one of I/O contacts 220a and 220b of device 204 to a respective one of terminal leads 221a and 221b. Flex circuit 240 also includes a pair of conductive traces 231a and 231b (trace 231b is not shown in FIG. 2) that connect I/O contacts 222a and 222b of device 205 to terminal leads 223a and 223b. Similarly, flex circuit 242 includes a pair of conductive traces 232a and 232b (trace 232b is not shown in FIG. 2) that connect I/O contacts 224a and 224b of device 206 to terminal leads 225a and 225b. In this fashion, the pair of conductive traces for a given switching device act as input and output signal carriers for the switching device. According to an embodiment of the invention, flex circuits 240 and 242 replace the twisted wire pairs of the prior art.

Figure 3A:
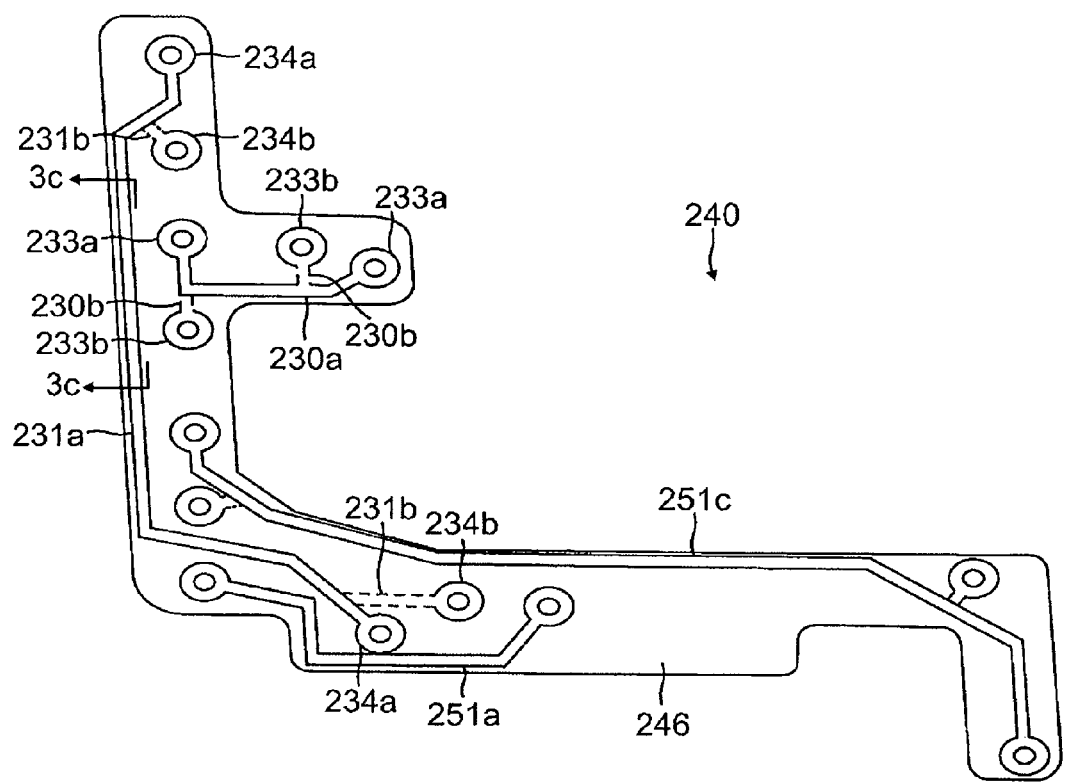
FIGS. 3A and 3B show a top perspective view and a bottom perspective view, respectively, of one of the flexible circuits of the power module of FIG. 2 according to an embodiment of the invention.
Figure 3B:
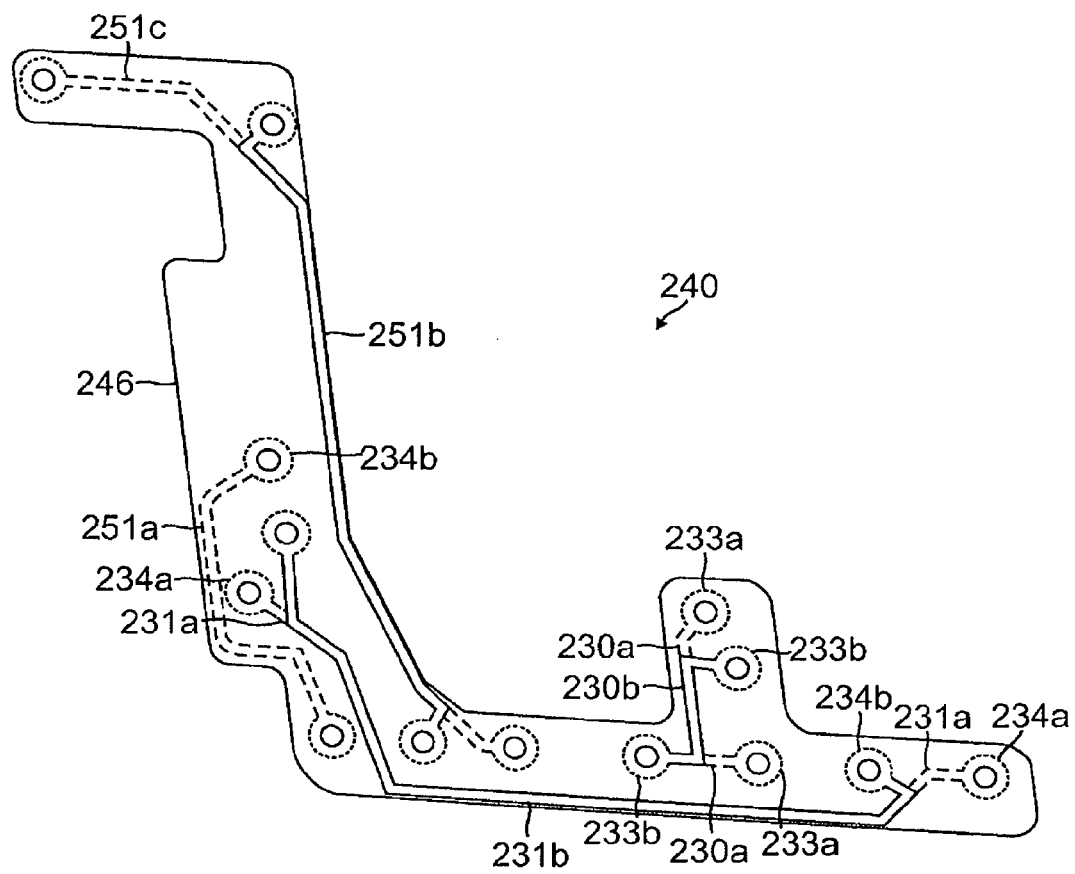
Figure 3C:
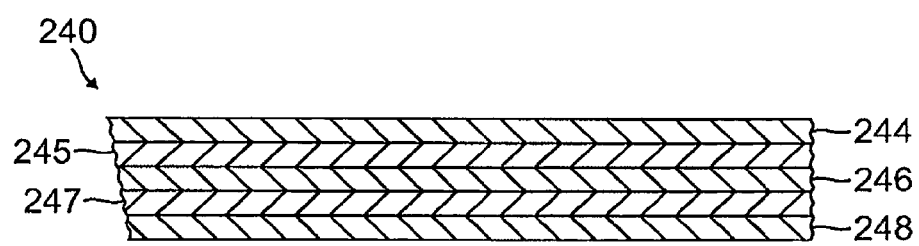
FIG. 3C shows a cross-sectional side view of a portion of the flexible circuit of FIG. 3A according to an embodiment of the invention.

Referring now to FIGS. 3A, 3B, and 3C there is shown a top view and a bottom view of flex circuit 240 in greater detail and a cross-sectional side view of a portion of this flex circuit, according to an embodiment of the invention. Note that flex circuit 242 resembles the structure of flex circuit 240. As generally shown in FIG. 3C, flex circuit 240 preferably includes at least two conductive layers 245 and 247 made of copper for example and separated by a flexible dielectric layer 246 made of polymide, for example, or some other dielectric material known in the art. Another dielectric layer 248 may be disposed over the lower conductive layer 247 along the bottom of flex circuit 240. A further dielectric layer 244 may be disposed over the upper conductive layer 245 along the top of flex circuit 240. Accordingly, each flex circuit may have from three to five layers. One skilled in the art will recognize, however, that each flex circuit may include more than five layers, having additional conductive layers interspersed by dielectric layers. One skilled in the art will also recognize that each flex circuit may include only a single conductive layer.

According to an embodiment of the invention and as shown in FIGS. 3A and 3B, the pair of conductive traces for each switching device are preferably disposed such that one trace resides in conductive layer 245 and the other trace resides in conductive layer 247. In addition, the pair of traces for each switching device are preferably configured such that the trace disposed in conductive layer 245 substantially resides directly over the trace disposed in conductive layer 247. In this fashion, the pair of traces for a given switching device run substantially in parallel along the flex circuit. For example, conductive traces 230a/b corresponding to device 204 may have trace 230a disposed in conductive layer 245 and trace 230b disposed in conductive layer 247. Similarly, conductive traces 231a/b corresponding to device 205 may have trace 231a disposed in conductive layer 245 and trace 231b disposed in conductive layer 247. Note that FIG. 3A has dielectric layer 244 removed and thereby shows traces 230a and 231a in their entirety and only shows a portion of traces 230b and 231b, these traces being shown in phantom line and being covered by dielectric layer 246 and partially concealed by traces 230a and 231a. Similarly, FIG. 3B has dielectric layer 248 removed and thereby shows traces 230b and 231b in their entirety and only shows a portion of traces 230a and 231a, these traces being shown in phantom line and being covered by dielectric layer 246 and partially concealed by traces 230b and 231b. Notably, the parallel configuration of the traces achieves the same affect as the twisted pairs of the prior art, reducing the inductive coupling between the traces.

One skilled in the art will recognize that while the pair of conductive traces for a given switching device are preferably disposed in opposing conductive layers and in a parallel configuration, the traces may also be disposed in opposing conductive layers but not in a parallel configuration. Similarly, the traces may be disposed in the same conductive layer.

As further shown in FIGS. 3A and 3B and according to an embodiment of the invention, each conductive trace of a trace pair terminates at opposing ends thereof in a plated through hole that extends vertically through flex circuit 240. For example, conductive trace 230a terminates in conductive though holes 233a and conductive trace 230b terminates in conductive through holes 233b. Similarly, conductive trace 231a terminates in conductive though holes 234a and conductive trace 231b terminates in conductive through holes 234b. As shown in FIG. 3A, each conductive through hole may have a corresponding solder pad on the upper surface of the flex circuit.

As shown in FIG. 2, the conductive through holes of the trace pairs seat over the solder lugs of the I/O contacts and terminal leads of the respective switching devices, thereby electrically connecting the traces to the lugs. A conductive adhesive, such a solder, may be applied to each lug and the solder pad of each conductive through hole. As an example, conductive through holes 233a may seat over I/O contact 220a and terminal lead 221a, thereby connecting the control electrode of device 204 to terminal lead 221a, and conductive through holes 233b may seat over I/O contact 220b and terminal lead 221b, thereby connecting the current sense connection of device 204 to terminal lead 221b. Similarly, conductive through holes 234a may seat over I/O contact 222a and terminal lead 223a, thereby connecting the control electrode of device 205 to terminal lead 223a, and conductive through holes 234b may seat over I/O contact 222b and terminal lead 223b, thereby connecting the current sense connection of device 205 to terminal lead 223b. As described above, flex circuits 240 and 242 are configured such that the traces connected to the control electrodes of the switching devices are disposed in conductive layer 245 and the traces connected to the current sense connections of the devices are disposed in conductive layer 247. Nonetheless, one skilled in the art will recognize that this configuration may be reversed. In addition, one skilled in the art will recognize that the configuration may vary between switching devices.

According to an embodiment of the invention, in addition to the traces of a flexible circuit being configured to have low inductance, the traces are preferably configured to have a short trace path.

According to another embodiment of the invention, one or more of the switching devices of power module 200 may have a gate protection device, such as a zener diode or transient voltage suppressor (TVS), integrated into the power module. Specifically, according to this embodiment of the invention, gate protection devices may be directly mounted on flex circuits 240 and/or 242 and connected to the traces corresponding to the control electrodes of the devices. Similarly, gate resistors may be directly mounted on flex circuits 240 and/or 242 for one or more of the switching devices.

According to a further embodiment of the invention, one or more gate drivers may be integrated into the power module to provide gate control signals to one or more of the switching devices. Specifically, according to this embodiment of the invention, the gate drivers may be directly mounted on flex circuits 240 and/or 242 and connected to the traces corresponding to the control electrodes of the devices. Here, the traces corresponding to the control electrodes may terminate at the gate drivers rather than at the terminal leads, as described above. Similarly, the current sense connections of the switching devices may also be integrated with these flex circuits, such as placing shunt resistors on the flex circuits in the switching device current paths. Similarly, according to this embodiment of the invention, one or more gate protection devices and/or gate resistors may also be mounted to the flex circuits.

One skilled in the art will recognize that the present invention is not limited to the use of I/O contacts to electrically connect flex circuits 240 and 242 to the input and output of the switching devices and that any method known in the art may be used.

One skilled in the art will also recognize that the flex circuits of the present invention are not limited to interfacing with switching devices. For example, power module 200 also includes an inrush current control section 250 that includes three associated I/O contacts 252a, 252b, and 252c that are interfaced to three terminal leads 253a, 253b, and 253c through traces 251a, 251b, and 251c of flex circuit 240 in a manner as similarly described for the switching devices, for example.

Advantageously, the flex circuits of the present invention are simpler to install as compared to the twisted wire pairs of the prior art, thereby reducing manufacturing process times and thereby module cost. In addition, because multiple copies of the flex circuits may fabricated to be substantially identical, there is consistency between power modules. As indicated above, the use of parallel traces also achieves the same affect as the twisted wire pairs, reducing the inductive coupling between the traces. Furthermore, the use of the flex circuits makes it easier to design a balanced gate loop and also makes it easier to design for high voltage isolation. Again, such design simplifications reduce module cost.

Although the present invention has been described in relation to particular embodiments thereof, many other variations and modifications and other uses will become apparent to those skilled in the art. Therefore, the present invention should be limited not by the specific disclosure herein, but only by the appended claims.

What is claimed is:

1. A power module, comprising:
   a substrate that includes a metallic trace formed on a first major surface thereof;
   a power switching device mounted on said metallic trace on said first major surface of said substrate; and
   a flexible circuit including a first conductive layer having a first trace disposed over a second conductive layer having a second trace and a flexible dielectric layer disposed between said first and second conductive layers, said first trace electrically connected to a gate electrode of said switching device and said second trace electrically connected to a current sense connection of said switching device; and
   first and second terminal leads on said substrate to provide external access to said power module, said first terminal lead being electrically connected to said first trace and said second terminal lead being electrically connected to said second trace, wherein said first trace is disposed directly over and runs parallel with said second trace on opposing parallel surfaces of said flexible dielectric layer.

2. The power module of claim 1, further comprising a gate driver disposed on said flexible circuit and operatively connected to said first trace to provide a control signal to operate said power switching device.

3. The power module of claim 1, further comprising a shunt resistor disposed on said flexible circuit and operatively connected to said second trace.

4. The power module of claim 1, further comprising a gate protection device disposed on said flexible circuit and operatively connected to said first trace to provide gate protection.

5. The power module of claim 4, wherein said gate protection device is either a zener diode or a transient voltage suppressor.

6. The power module of claim 1, further comprising a gate resistor disposed on said flexible circuit and operatively connected to said first trace.

7. The power module of claim 1, wherein said power switching device is an IGBT.

8. The power module of claim 1, wherein said first and second traces are configured to reduce inductive coupling between the traces.

9. The power module of claim 1, wherein said flexible dielectric is comprised of polyimide.

10. The power module of claim 1, further comprising a first dielectric over said first trace and a second dielectric over said second trace.

* * * * *